(12) United States Patent
Endo

(10) Patent No.: US 7,737,484 B2
(45) Date of Patent: Jun. 15, 2010

(54) SEMICONDUCTOR MEMORY DEVICE AND METHOD OF MANUFACTURING THE SAME

(75) Inventor: Masato Endo, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 11/862,586

(22) Filed: Sep. 27, 2007

(65) Prior Publication Data
US 2008/0239816 A1  Oct. 2, 2008

(30) Foreign Application Priority Data
Sep. 28, 2006  (JP) .............................. 2006-264376

(51) Int. Cl.
*H01L 29/788* (2006.01)
(52) U.S. Cl. .............................. 257/316; 257/E21.626; 257/E21.64; 257/900
(58) Field of Classification Search ................. 257/316, 257/317, E21.626, E21.64, 900
See application file for complete search history.

(56) References Cited

U.S. PATENT DOCUMENTS

| | | | |
|---|---|---|---|
| 5,877,523 A * | 3/1999 | Liang et al. ................. 257/315 |
| 6,051,467 A | 4/2000 | Chan et al. |
| 6,462,375 B1 * | 10/2002 | Wu ............................. 257/316 |
| 2004/0018682 A1 | 1/2004 | Iguchi et al. |
| 2005/0151204 A1 * | 7/2005 | Jung .......................... 257/377 |
| 2006/0186459 A1 * | 8/2006 | Chang et al. ................. 257/315 |
| 2007/0034955 A1 * | 2/2007 | Kim et al. .................... 257/349 |
| 2007/0278531 A1 * | 12/2007 | Choi et al. ................... 257/213 |

OTHER PUBLICATIONS

U.S. Appl. No. 12/407,131, filed Mar. 19, 2009, Sakuma.

* cited by examiner

*Primary Examiner*—David Vu
*Assistant Examiner*—Earl N Taylor
(74) *Attorney, Agent, or Firm*—Oblon, Spivak, McClelland, Maier & Neustadt, L.L.P.

(57) ABSTRACT

A semiconductor memory device comprises a memory cell unit including at least one memory cell having a structure with a floating gate and a control gate stacked via an insulator on a semiconductor substrate. A common source line is connected to one end of the memory cell unit. A bit line is connected to the other end of the memory cell unit. The control gate has at least an upper portion with a width along the gate length formed wider than the width of the floating gate.

12 Claims, 17 Drawing Sheets

(B) Cell Region in B-B' Section (A) Cell Region in A-A' Section (B) Cell Region in B-B' Section (C) Peripheral Transistor Region in Section (A) Cell Region in A-A' Section (B) Cell Region in B-B' Section (C) Peripheral Transistor Region in Section (A) Cell Region in A-A' Section (B) Cell Region in B-B' Section (C) Peripheral Transistor Region in Section (A) Cell Region in A-A' Section (B) Cell Region in B-B' Section (C) Peripheral Transistor Region in Section (A) Cell Region in A-A' Section (B) Cell Region in B-B' Section (C) Peripheral Transistor Region in Section

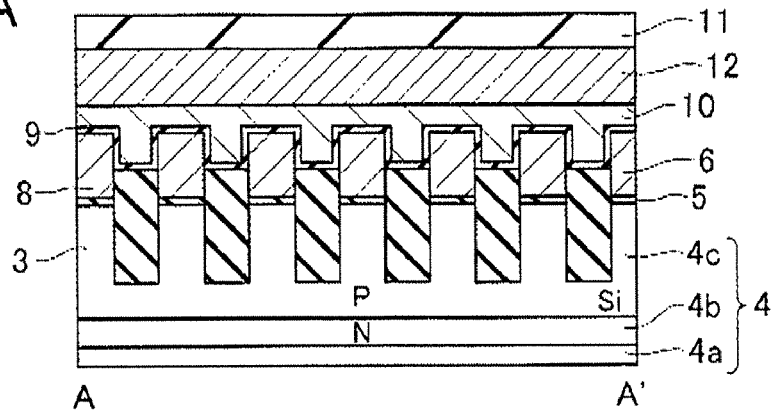
(A) Cell Region in A-A' Section
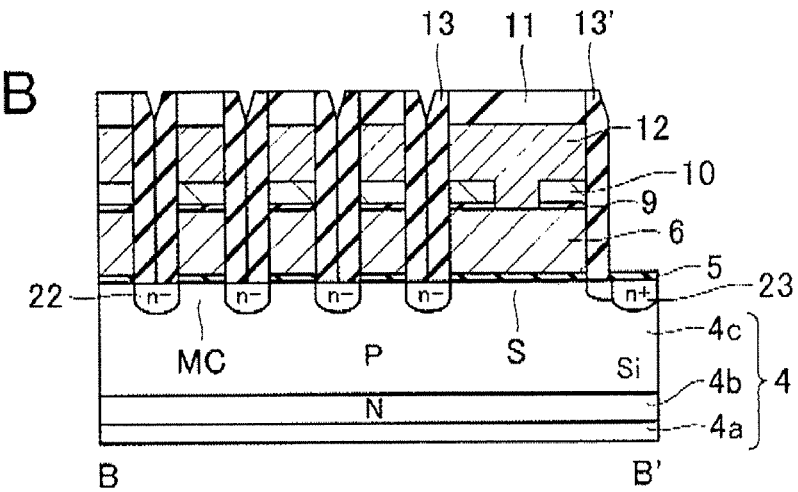
(B) Cell Region in B-B' Section
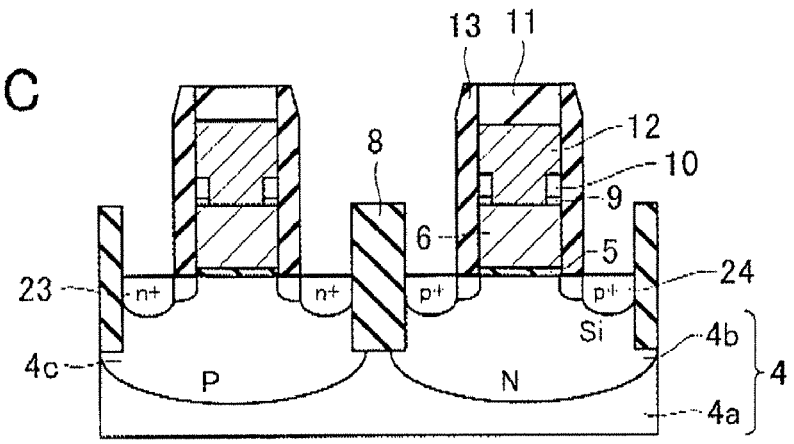
(C) Peripheral Transistor Region in Section (A) Cell Region in A-A' Section (B) Cell Region in B-B' Section (C) Peripheral Transistor Region in Section (A) Cell Region in A-A' Section (B) Cell Region in B-B' Section (C) Peripheral Transistor Region in Section (A) Cell Region in A-A' Section (B) Cell Region in B-B' Section (C) Peripheral Transistor Region in Section (A) Cell Region in A-A' Section (B) Cell Region in B-B' Section (C) Peripheral Transistor Region in Section (A) Cell Region in A-A' Section (B) Cell Region in B-B' Section (C) Peripheral Transistor Region in Section (A) Cell Region in A-A' Section (B) Cell Region in B-B' Section (C) Peripheral Transistor Region in Section (A) Cell Region in A-A' Section (B) Cell Region in B-B' Section (C) Peripheral Transistor Region in Section (A) Cell Region in A-A' Section (B) Cell Region in B-B' Section (C) Peripheral Transistor Region in Section Taper Angle after Processing Word Line Reduces Upper Width of Word Line Cell Region in B-B' Section

SEMICONDUCTOR MEMORY DEVICE AND METHOD OF MANUFACTURING THE SAME

CROSS-REFERENCE TO RELATED APPLICATION

This application is based upon and claims the benefit of prior Japanese Patent Application No. 2006-264376, filed on Sep. 28, 2006, the entire contents of which are incorporated herein by reference.

BACKGROUND OF THE INVENTION

1. Field of the Invention

The present invention relates to a semiconductor memory device having a gate structure with a floating gate and a control gate stacked, and also relates to a method of manufacturing the same.

2. Description of the Related Art

Semiconductor memory devices known in the art include electrically programmable non-volatile semiconductor memory devices (EEPROMs). Among those, attention has been given to an NAND-type EEPROM, because it can be highly integrated, which includes an NAND cell having a plurality of serially connected memory cells each serving as a unit for one bit storage. The NAND-type has been widely utilized, for example, in memory cards for storing image data from digital still cameras.

A memory cell in the NAND-type EEPROM has a MOS-FET structure with a floating gate (charge accumulation layer) and a control gate (CG) stacked via an insulator on a semiconductor substrate serving as a channel region. A memory cell unit comprises a circuit with a plurality of memory cells serially connected such that adjacent ones share an impurity region (source/drain), and selection gate transistors connected to both ends of the serial circuit, respectively. One of the selection gate transistors has a drain connected to a bit line extending in parallel with the direction of memory cells arrayed, and the other of the selection gate transistors has a source connected to a source line. The control gates of the memory cells form word lines extending orthogonal to the bit line, and the gates of the selection gate transistors form selection gates extending orthogonal to the bit line. The control gates of the memory cells and so forth contained in the word lines are usually controlled to exhibit lower resistances through formation of silicide (see JP 2004-63789A, paragraph 0031, FIG. 25, for example).

In such the semiconductor memory devices of the prior art, fine patterning of word lines in accordance with fine-patterned memory cells in recent years causes a problem associated with word lines having increased resistances. In particular, if the word lines are silicided, an increase in resistance variation due to unevenness among metal silicide films, and deterioration due to agglomeration may cause a problem. This problem is regarded as a result of a number of metal silicide films produced in an extremely small area.

SUMMARY OF THE INVENTION

In one embodiment the present invention provides a semiconductor memory device, comprising: a memory cell unit including at least one memory cell having a structure with a floating gate and a control gate stacked via an insulator on a semiconductor substrate; a common source line connected to one end of the memory cell unit; and a bit line connected to the other end of the memory cell unit, wherein the control gate has at least an upper portion with a width along the gate length formed wider than the width of the floating gate.

In another embodiment the present invention provides a semiconductor memory device, comprising: a memory cell unit including at least one memory cell having a stacked-gate structure with a floating gate and a control gate stacked via an insulator on a semiconductor substrate; a common source line connected to one end of the memory cell unit; and a bit line connected to the other end of the memory cell unit, wherein the control gate includes a metal silicide film in an upper portion, wherein the metal silicide film has a width formed wider along the gate length than the width of the floating gate.

In one embodiment the present invention provides a method of manufacturing a semiconductor memory device provided with a memory cell unit including at least one memory cell having a structure with a floating gate and a control gate stacked via an insulator on a semiconductor substrate, the method comprising; forming an aperture through a portion for depositing at least an upper layer portion of the control gate therein; extending the width of the aperture along the gate length; depositing an electrode film as part of the control gate in the width-extended aperture; and metal-siliciding the deposited electrode film.

BRIEF DESCRIPTION OF THE DRAWINGS

FIGS. 7A-7C are cross-sectional views showing the NAND-type EEPROM in order of process step.

DETAILED DESCRIPTION OF THE EMBODIMENTS

The embodiments of the present invention will now be described with reference to the drawings.

Figure 16:
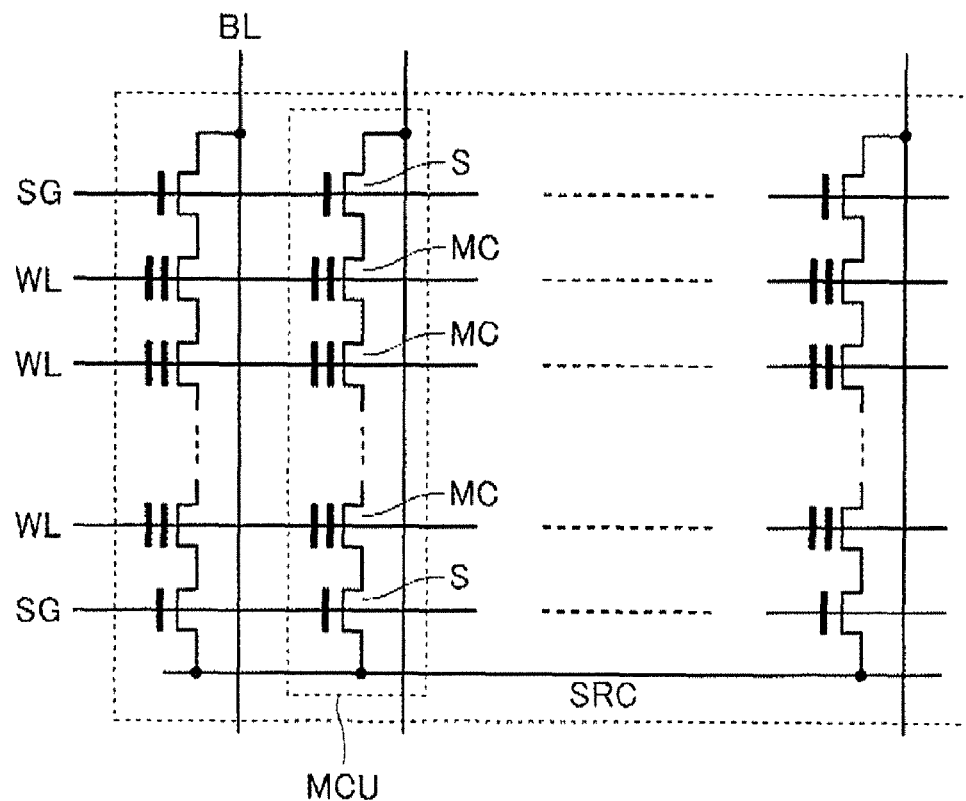
FIG. 16 is a circuit diagram of the NAND-type EEPROM.

FIG. 16 is a circuit diagram of an NAND-type EEPROM. An NAND-type memory cell unit MCU comprises a circuit with a plurality of memory cells MC serially connected such that adjacent ones share an impurity region (source/drain), and selection gate transistors S connected to both ends of the circuit, respectively. One of the selection gate transistors S has a drain connected to a bit line BL extending in parallel with the direction of memory cells MC arrayed, and the other of the selection gate transistors S has a source connected to a source line SRC. The control gates of the memory cells MC form word lines WL extending orthogonal to the bit line BL, and the gates of the selection gate transistors S form selection gates SG extending orthogonal, to the bit line BL.

Figure 1:
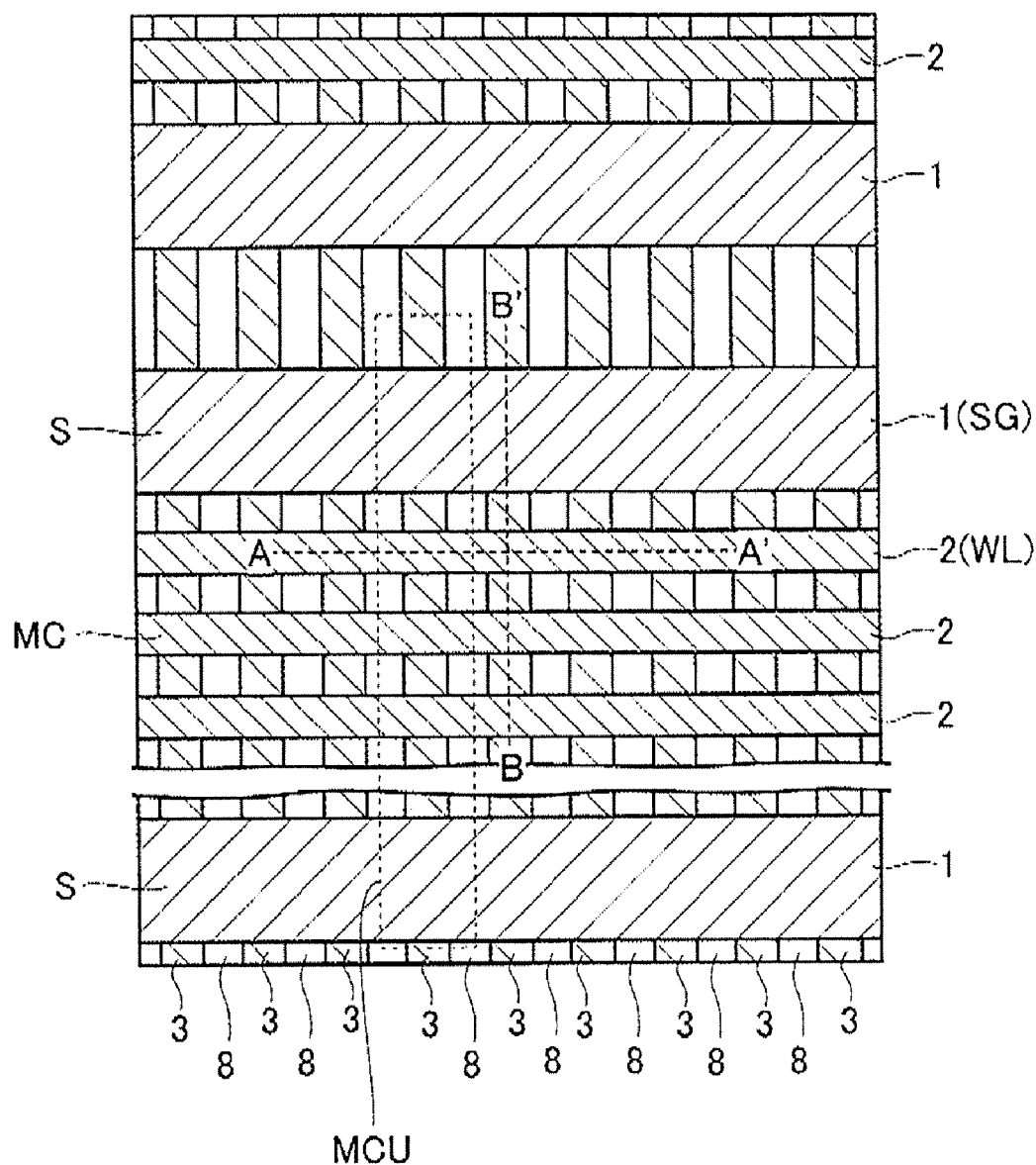
FIG. 1 is a plan view of an NAND-type EEPROM (non-volatile semiconductor memory device) according to one embodiment of the present invention.
Figure 2A:
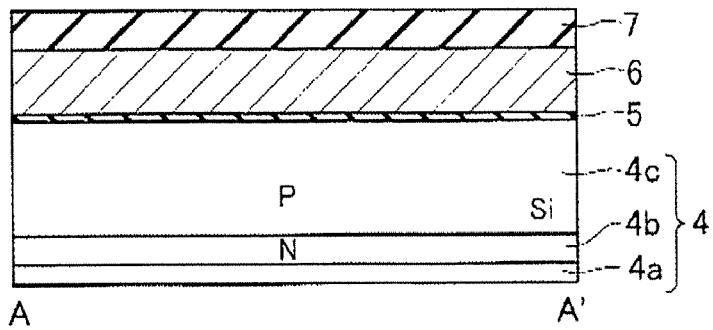
FIGS. 2A-2C are cross-sectional views showing the NAND-type EEPROM in order of process step.
Figure 2B:
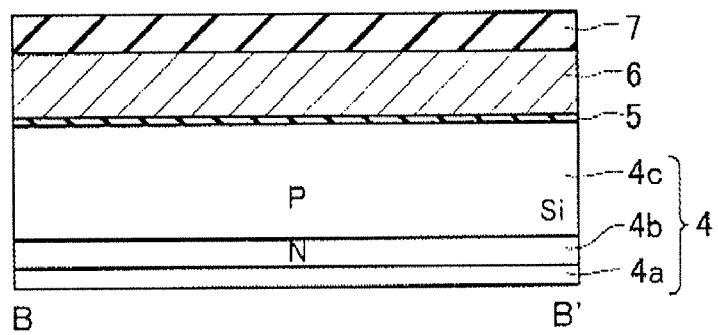
Figure 2C:
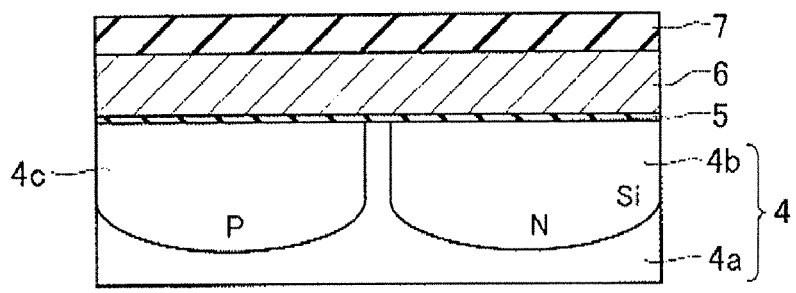

FIG. 1 is a plan view of a cell region in the NAND-type EEPROM (nonvolatile semiconductor memory device) according to one embodiment of the present invention, in which the same parts as those in the circuit diagram of FIG. 16 are denoted with the same reference numerals. The cell region includes a plurality of memory cell units (MCU). A peripheral transistor region, not shown, is formed around the cell region. The cell region is used to form selection gates 1 (SG) extending laterally in the figure, and a plurality of wordlines 2 (WL) sandwiched between the selection gates 1 and extending in parallel with the selection gates 1. There are device formation regions 3 defined beneath the selection gates 1 and the word lines 2 by a plurality of device isolation films 8 extending orthogonal to. A memory cell MC (hereinafter also referred to as "cell transistor") is formed at an intersection of the word line 2 and the device formation region 3. A selection gate transistor S is formed at an intersection of the selection gate 1 and the device formation region 3. Although not shown in the figure, the bit line BL is formed in an upper layer above the selection gate 1 and the word line 2.

FIGS. 2-15 are cross-sectional views showing the NAND-type EEPROM of the present embodiment in order of process step. FIGS. 2A-15A are cross-sectional views taken along A-A' in FIG. 1. FIGS. 2B-15B are cross-sectional views taken along B-B' in FIG. 1. FIGS. 2C-15C are cross-sectional views, taken in parallel with B-B' line, of the peripheral transistor region formed through the same steps as those for the cell region although not shown in FIG. 1.

Figure 15A:
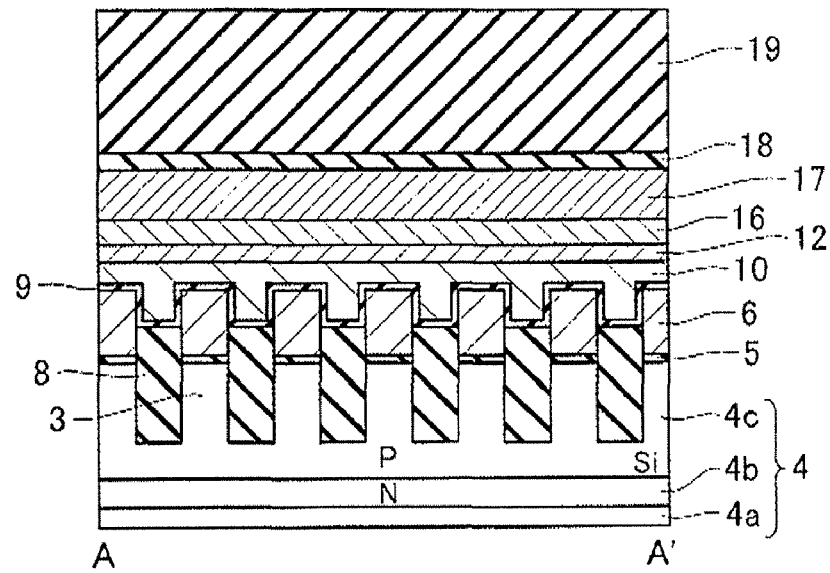
FIGS. 15A-15C are cross-sectional views showing the NAND-type EEPROM in order of process step.
Figure 15B:
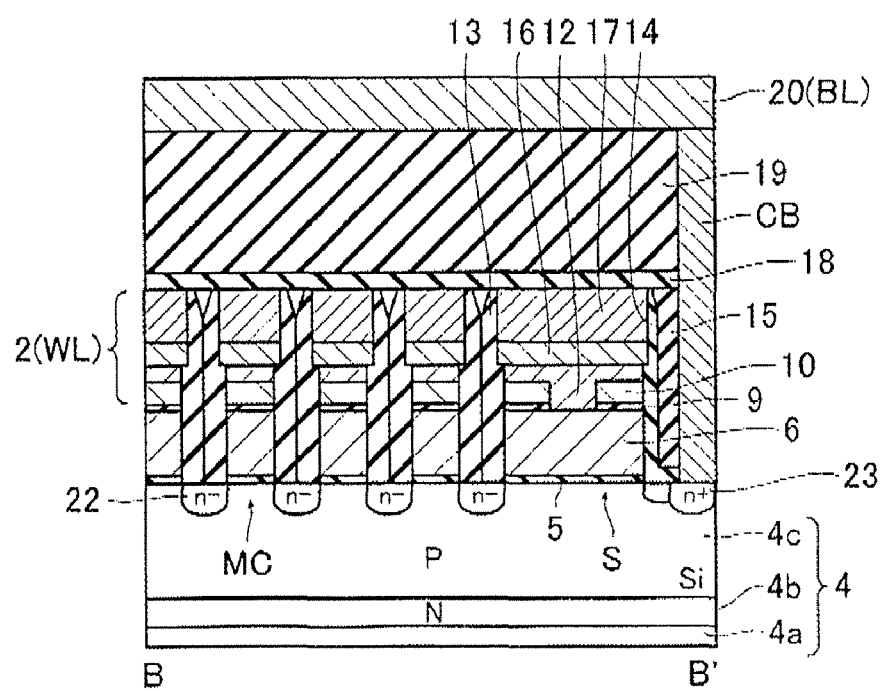
Figure 15C:
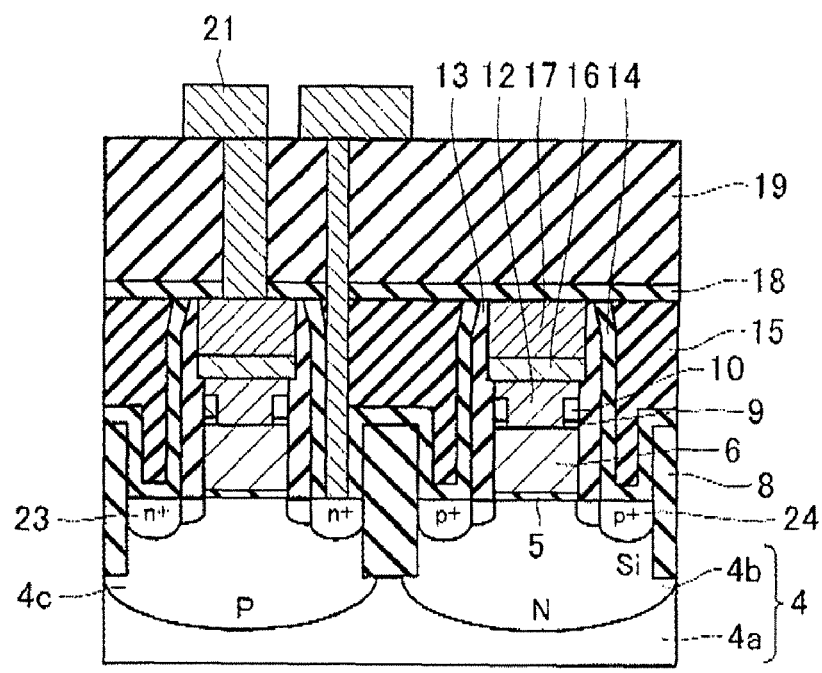

In FIGS. 15A-15C, a semiconductor substrate 4 composed of silicon has the following well structure. Namely, an n-type well 4b is formed in a silicon substrate 4a, a p-type well 4c is formed in the cell region of the n-type well 4b, and the n-type well 4b and the p-type well 4c are formed adjacent to each other in the peripheral transistor region. The semiconductor substrate 4 includes device formation regions 3 in the form of stripes formed therein, which are isolated from each other along the word line 2 by the device isolation films 8. A device formation region 3 with a smaller width in the B-B' direction serves as the transistor for the memory cell MC while a device formation region 3 with a larger width in the B-B' direction serves as the selection gate transistor S. In each device formation region 3 for the memory cell MC, a first electrode film 6 serving as a floating gate is formed via a first insulator 15 on the semiconductor substrate 4. In addition, a second electrode film 10 serving as a control gate is formed via a second insulator 9 on the first electrode film 6. A third electrode film 12, a fourth electrode film 16 and a metal silicide film 17 are formed on the second electrode film 10 in this order. The films 10, 12, 16, 17 form the control gates, or the word lines 2 (WL) in the memory cell unit MCU. In each device formation region 3 for the selection gate transistor S, the first electrode film 6 is connected to the third electrode film 12 via an aperture. Therefore, in the selection gate transistor S, the films 6, 10, 12, 16, 17 form the selection gate 1 (SG). The fourth electrode film 16 and the metal silicide film 17 have widths along the gate length (B-B' direction) formed wider than the first electrode film 6, the second electrode film 10 and the third electrode film 12. Adjacent memory cells MC as well as the memory cell MC and the selection gate transistor S are isolated from each other by a third insulator 13 that extends from the semiconductor substrate 4 to the same height as the upper surface of the metal silicide film 17. The third insulator 13 adjoins the semiconductor substrate 4 at a position where a source/drain diffused-region 22 is formed such that it is shared between adjacent memory cells or the memory cell and the selection gate transistor. In a semiconductor layer of the selection gate transistor on the opposite side from the memory cell, diffused layers 23, 24 are provided to form contacts with electrode material and drains/sources.

On the gate side of the selection gate transistor on the opposite side from the memory cell, there are formed a fourth insulator 14 and a fifth insulator 15 that extend to the upper surface of the metal silicide film 17. The insulators 13, 14, and the metal silicide film 17 planarize the upper surface, on which a sixth insulator 18 and a seventh insulator 19 are stacked in this order. Appropriate apertures are formed through the insulators to form metal wiring material therein. Among those, a metal wiring material connected to the drain of the selection gate transistor S shown in FIG. 15B is a bit line 20.

Also in the peripheral transistor region, there is formed a peripheral transistor having almost the same structure a chat of the selection gate transistor in the cell region. The fourth electrode film 16 and the metal silicide film 17 have widths along the gate length (B-B' direction) formed wider than the first electrode film 6, the second electrode film 10 and the third electrode film 12. Appropriate apertures are formed through the insulators 15, 18, 19 to form a metal wiring material 21 therein.

The following description is given to the process steps of manufacturing the NAND-type EEPROM according to the present embodiment.

Figure 3A:
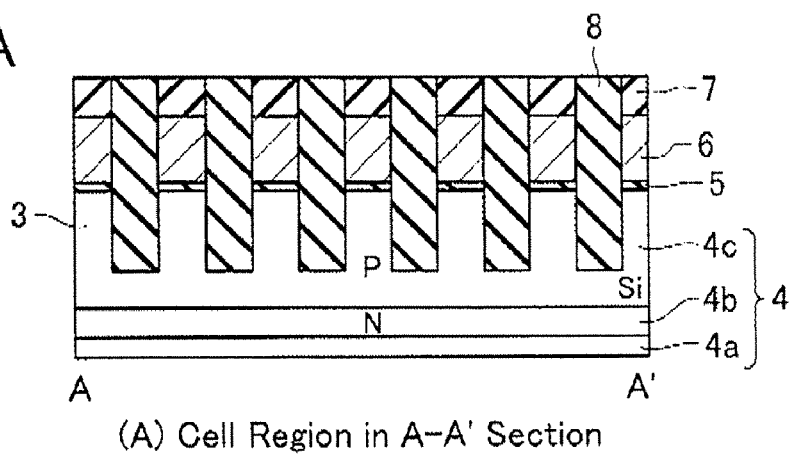
FIGS. 3A-3C are cross-sectional views showing the NAND-type EEPROM in order of process step.
Figure 3B:
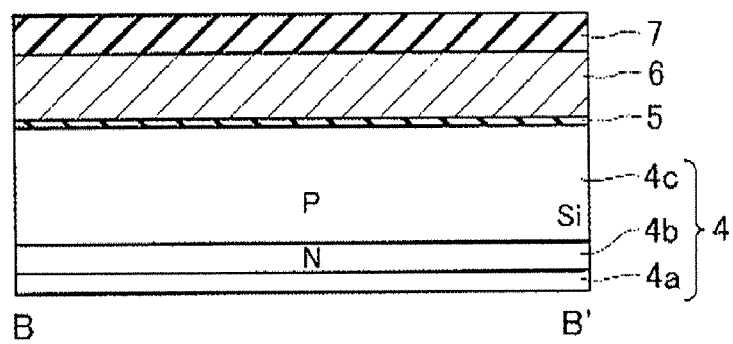
Figure 3C:
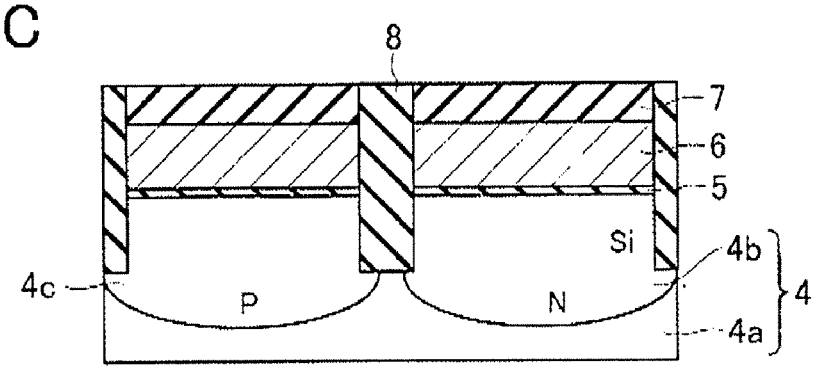
Figure 4A:
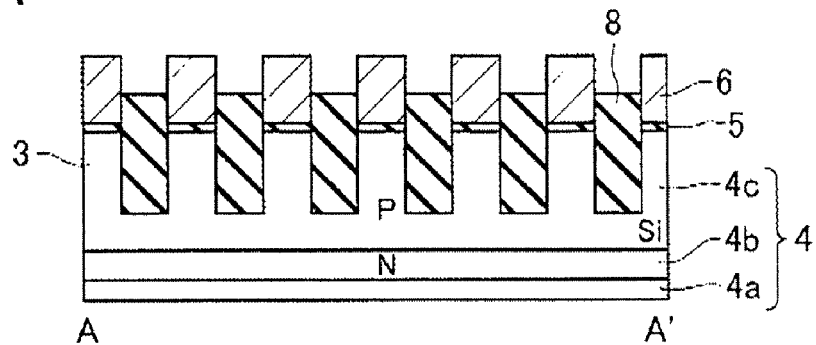
FIGS. 4A-4C are cross-sectional views showing the NAND-type EEPROM in order of process step.
Figure 4B:
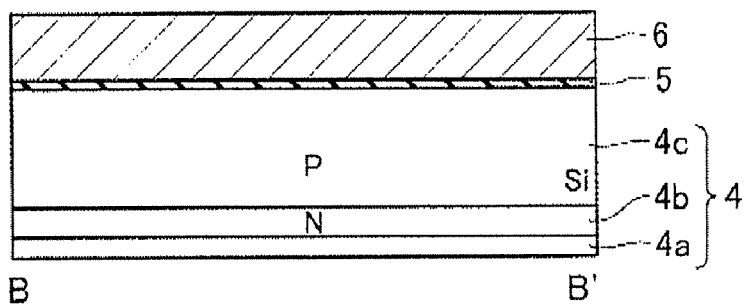
Figure 4C:
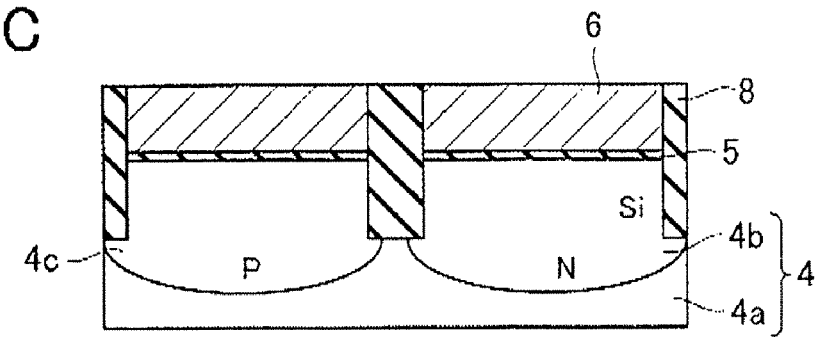

As shown in FIG. 2, the first insulator 5 is formed on the semiconductor substrate 4, and the first electrode film 6 is deposited thereon. The first insulator is turned into the tunneling oxide of the memory cell. MC and the gate oxide of the selection gate transistor S and the peripheral transistor an the cell region. The first electrode film is turned into the floating gate of the memory cell MC, the selection gate of the selection gate transistor and the gate of the peripheral transistor. A mask material 7 is deposited on the first electrode film 6. Next, as shown in FIG. 3, lithography and etching technologies are used to form the device isolation films 8 such that the device isolation films 8 form the device formation regions 3. Subsequently, as shown in FIG. 4, the device isolation films 8 are etched, and then the mask material 7 is peeled off. The device isolation films 8 in the cell region are etched to a position lower than the height of the first electrode film 6.

Figure 5A:
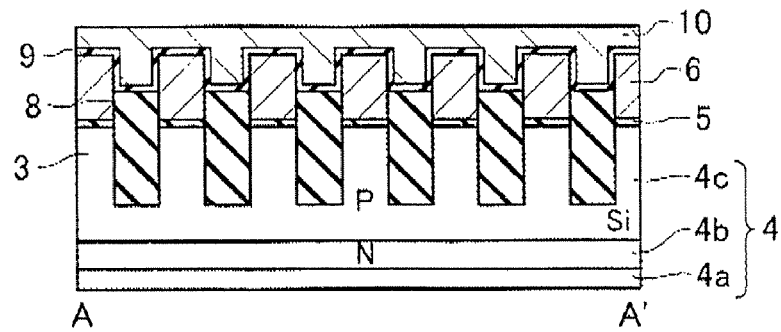
FIGS. 5A-5C are cross-sectional views showing the NAND-type EEPROM in order of process step.
Figure 5B:
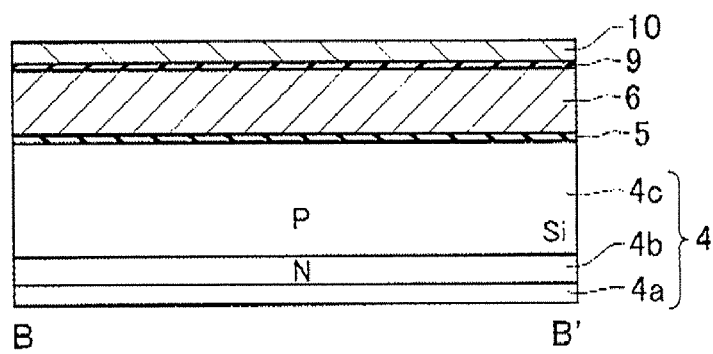
Figure 5C:
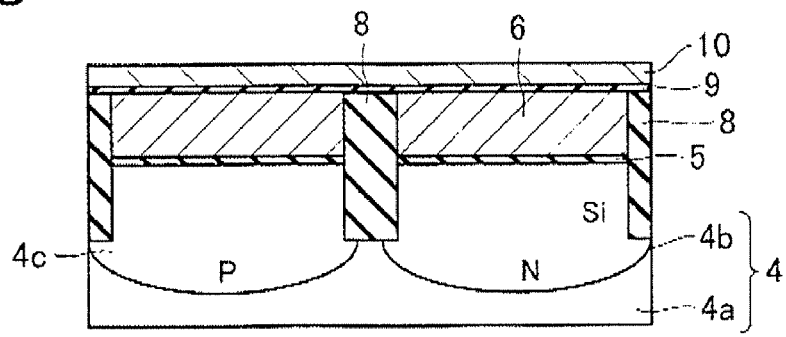

As shown in FIG. 5, the second insulator 9 is deposited and the second electrode film 10 is deposited thereon. The second insulator is turned into the inter-gate insulator of the memory cell MC. The second electrode film is turned into the control gate of the memory cell MC in part, and the selection gate of the selection gate transistor and the gate of the peripheral transistor in part.

Figure 6A:
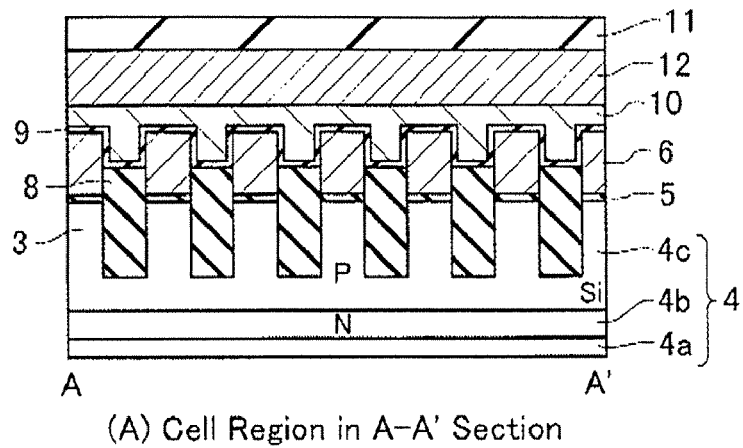
FIGS. 6A-6C are cross-sectional views showing the NAND-type EEPROM in order of process step.
Figure 6B:
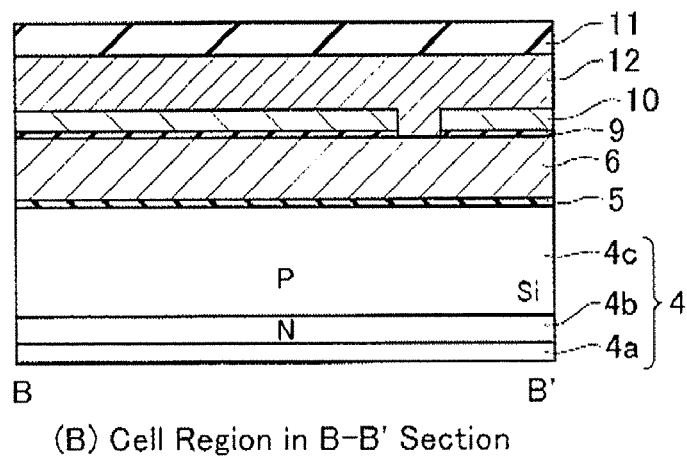
Figure 6C:
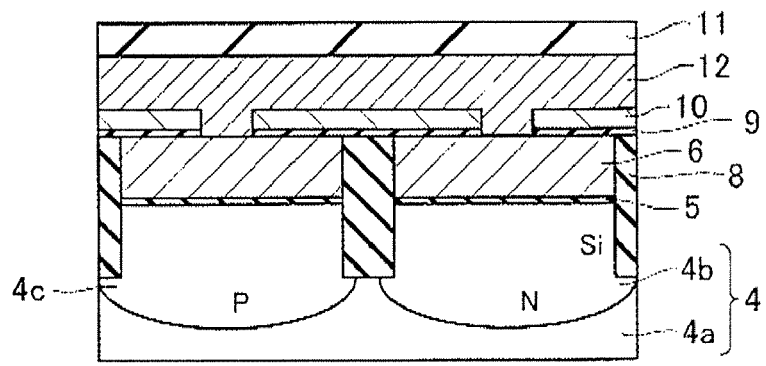

As shown in FIGS. 6B and 6C, in the cell region, the third electrode film 12 is electrically connected to the first electrode film 6 and the second electrode film 10. The third electrode film is turned into the selection gate of the selection gate of the peripheral transistor formed in the next step. To do so, the selection gate of the selection gate transistor S and the gate region of the gate of the peripheral transistor are partly peeled off. Alternatively, the second electrode film 10 and the second insulator 9 are entirely peeled off. Subsequently, as shown in FIG. 6, the third electrode film 12 is deposited, and then a mask material 11 is deposited thereon. The third electrode film 12 is turned into the control gate of the cell transistor MC, and the selection gate 1 of the selection gate transistor S and the gate electrode of the peripheral transistor.

As shown in FIGS. 7B and 7C, lithography and etching technologies are used to form the gate electrodes in the formation regions for the cell transistor MC, the selection gate transistor S and the peripheral transistor. Then, the gate electrodes are used as a mask to implant an N-type impurity into the semiconductor substrate 4 to form the drain/source diffused layer 22 and the diffused layers 23, 24 in a self-aligned manner. Subsequently, after the third insulator 13 is deposited, a selective etching technology is used to form gate sidewall structures on the cell transistor MC, the selection gate transistor S and the peripheral, transistor. An insulator is selected as the third insulator 13 such that it can achieve an appropriate etching ratio to the first electrode film 6, the second electrode film 10, the third electrode film 12 and the mask material 11.

Figure 8A:
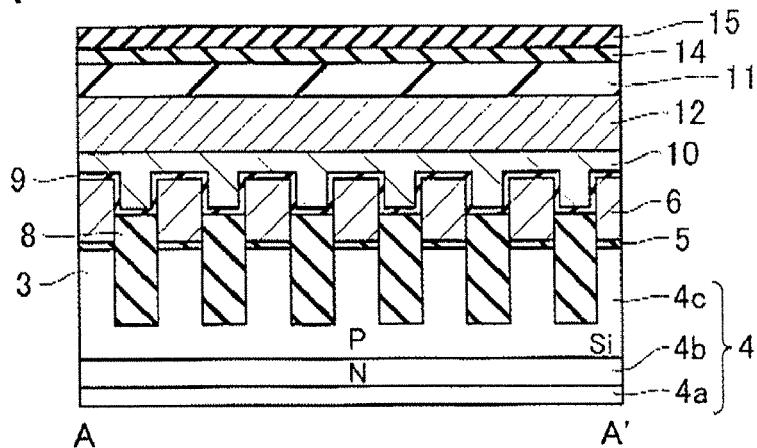
FIGS. 8A-8C are cross-sectional views showing the NAND-type EEPROM in order of process step.
Figure 8B:
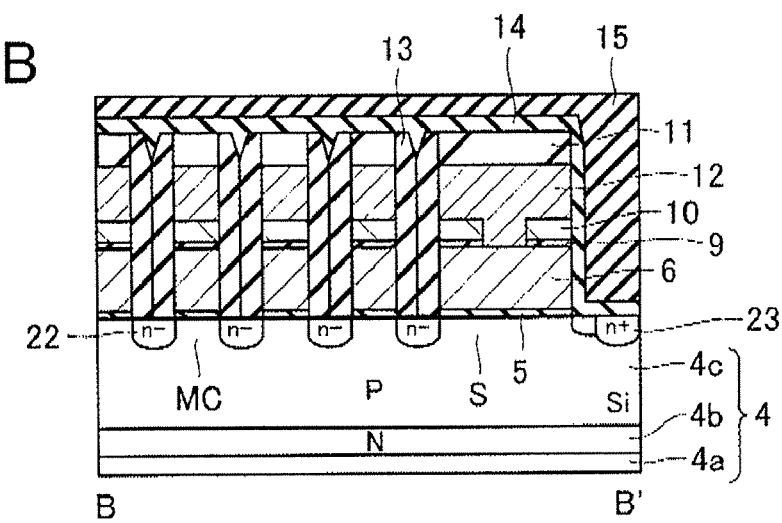
Figure 8C:
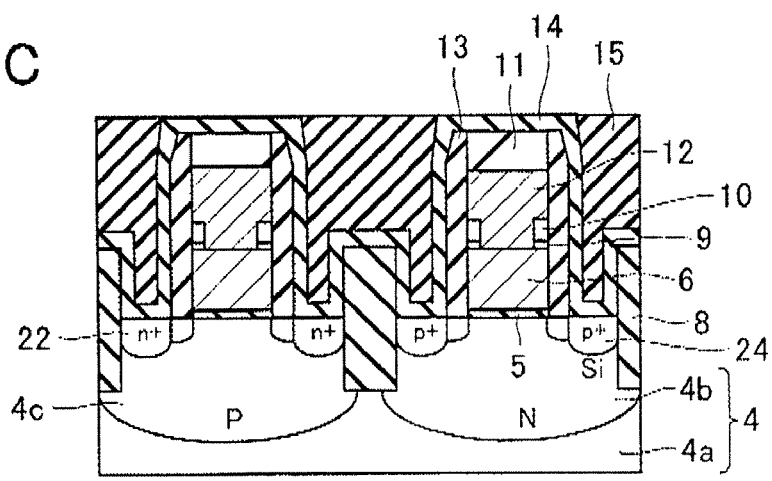

In order to extend the diameter of a bit contact CB later formed adjacent to the selection gate transistor S, lithography and etching technologies are used to peel off the third insulator 13' (FIG. 7B) left on the gate sidewalls of the selection gate transistor S. If the knit contact CB has a sufficiently lower resistance, the step of peeling off the third insulator 13' (FIG. 7B) left on the gate sidewalls of the selection gate transistor S may be omitted. Thereafter, as shown in FIG. 8, the fourth insulator 14 and the fifth insulator 15 are deposited.

Figure 9A:
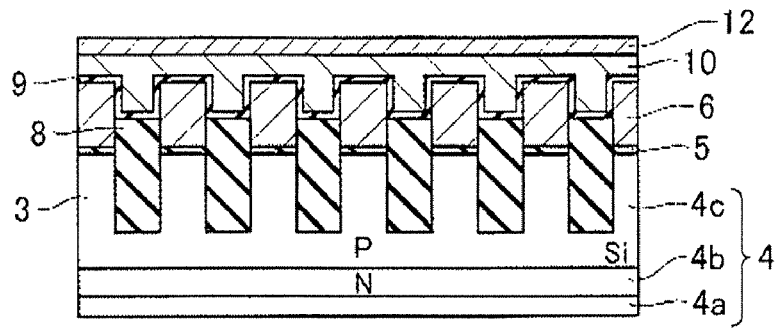
FIGS. 9A-9C are cross-sectional, views showing the NAND-type EEPROM in order of process step.
Figure 9B:
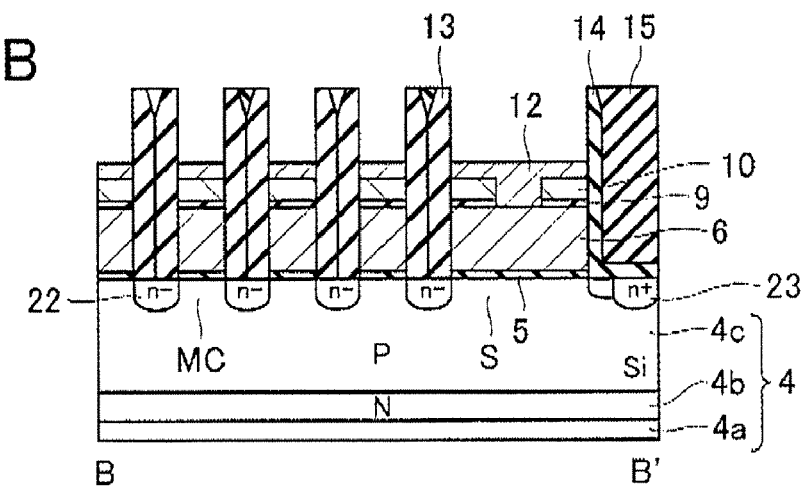
Figure 9C:
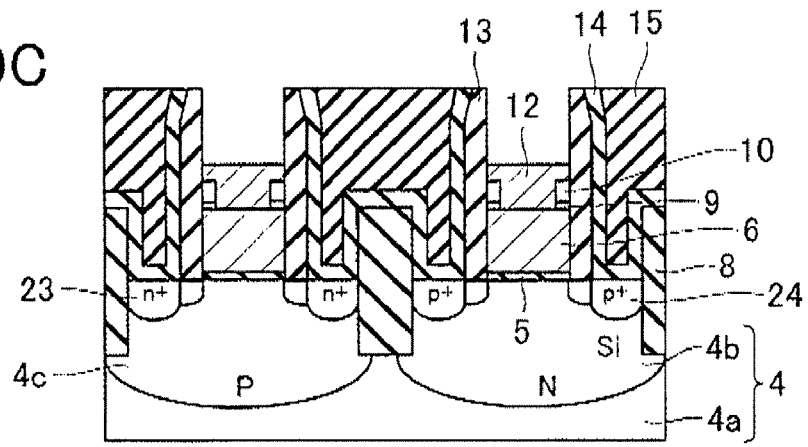

As shown in FIG. 9, an etching technology is used to peel off the fourth insulator 14, the mask material 11 and the fifth insulator 15 on the gates of the cell transistor MC, the selection gate transistor S and the peripheral transistor. Then, a process of etching is applied to thin the third electrode film 12 that is turned into the control gate of the cell transistor MC, the gates of the selection gate transistor S and the peripheral transistor in part. Thus, it is possible to increase the height of the gate electrode formed in an upper layer above the electrode film 12. The third electrode film 12 may initially be formed thin instead of the use of such the etching.

Figure 10A:
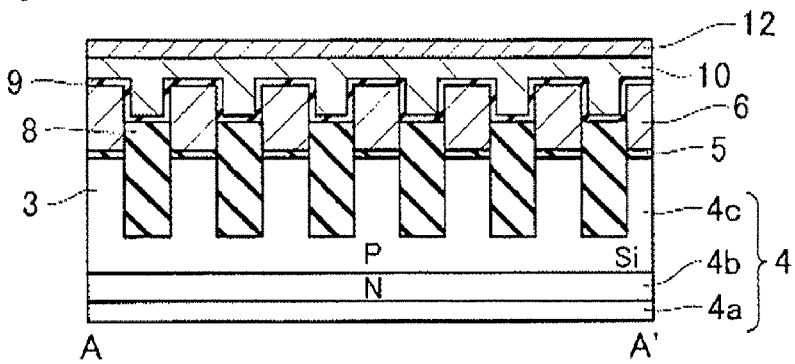
FIGS. 10A-10C are cross-sectional views showing the NAND-type EEPROM in order of process step.
Figure 10B:
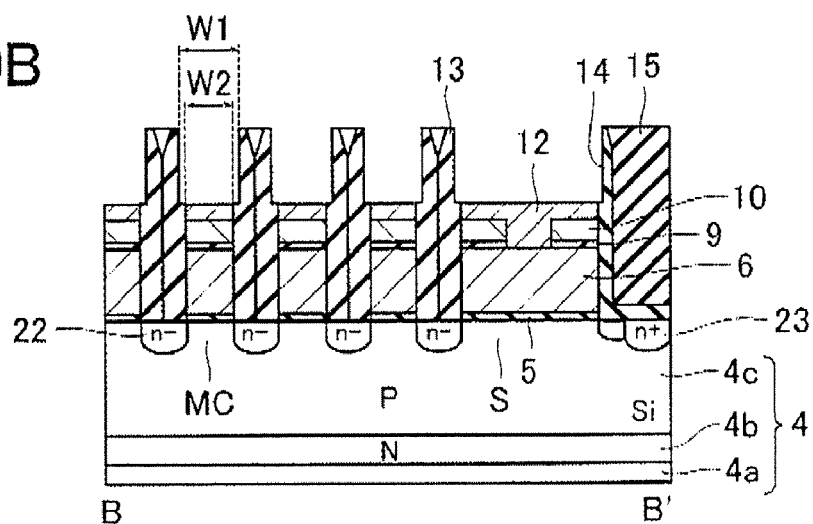
Figure 10C:
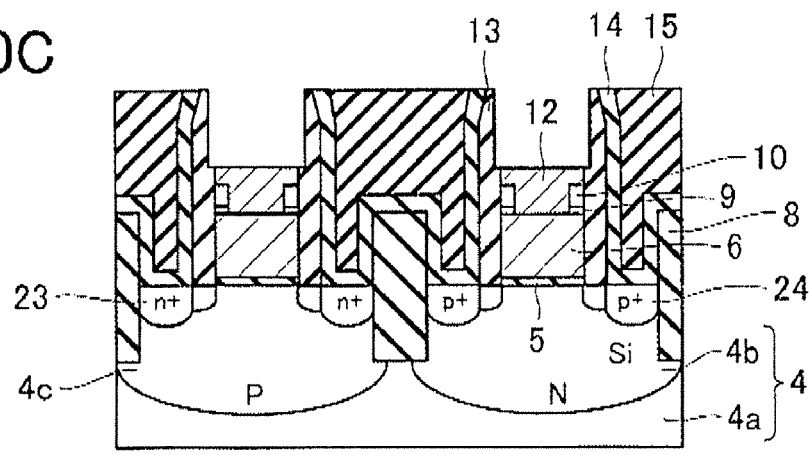

As shown in FIG. 10, a wet etching step is applied to etch back the inner walls of the portions of the third insulator 13 and the fourth insulator 14 located above the third electrode film 12. Thus, along the gate length (B-B' direction), the width W1 of the aperture in the upper portion of the third electrode film 12 can be made wider than the width W2 of the third electrode film 12, that is, the width of the first electrode film 6. For example, it is herein assumed that the third electrode film 12 is composed of polysilicon and the third insulator 13 is composed of silicon oxide and that this step is performed with a hydrofluoric acid-based wet etching. In this case, even if a natural oxide is formed over the surface of the third electrode film 12, the natural oxide can be removed at the same time. As a result, it is possible to effectively prevent an occurrence of failed contact between the later-formed fourth electrode film 16 and the third electrode film 12.

Figure 11A:
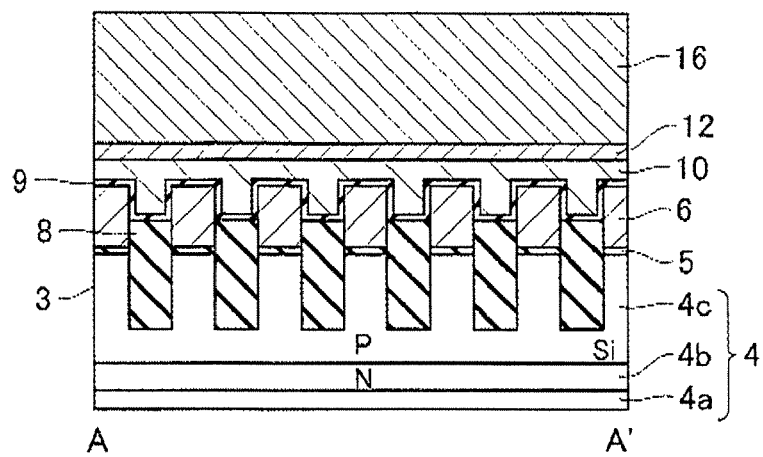
FIGS. 11A-11C are cross-sectional views showing the NAND-type EEPROM in order of process step.
Figure 11B:
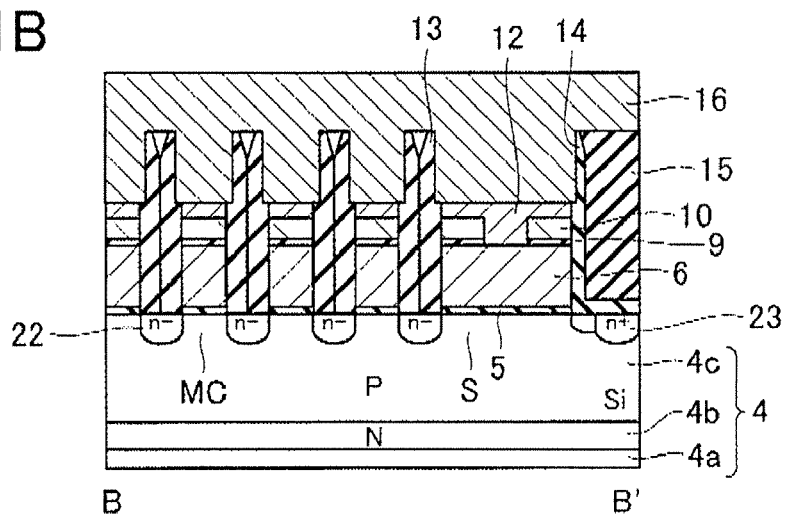
Figure 11C:
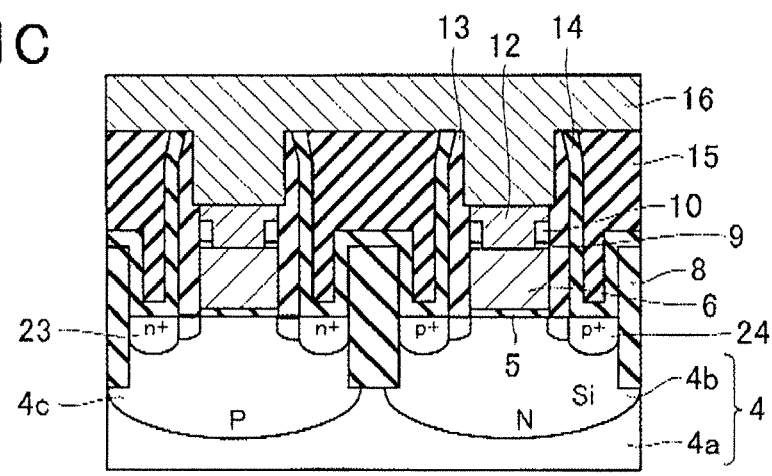
Figure 12A:
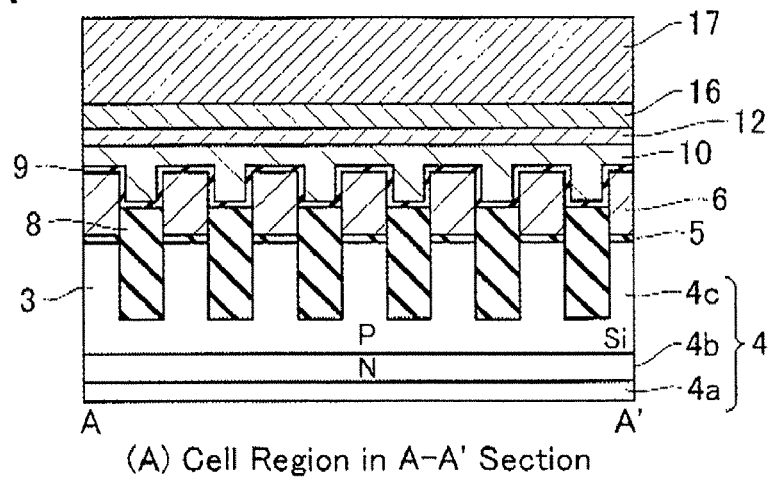
FIGS. 12A-12C are cross-sectional views showing the NAND-type EEPROM in order of process step.
Figure 12B:
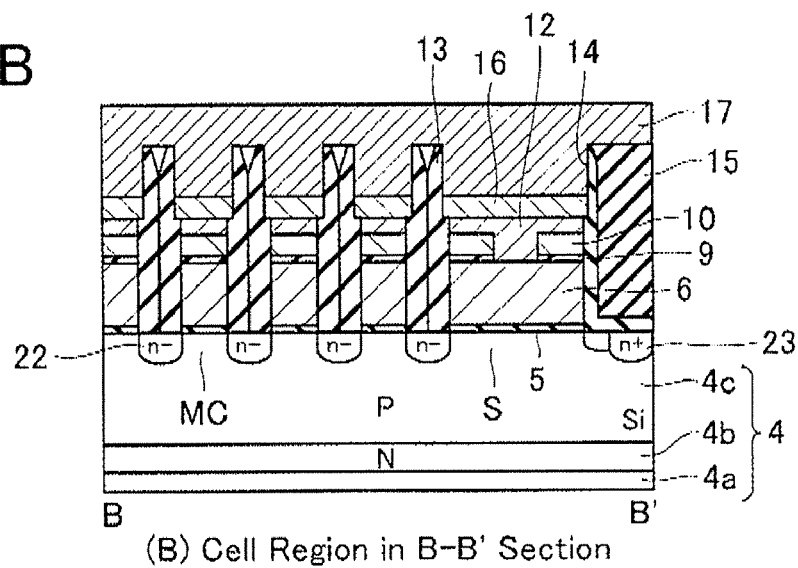
Figure 12C:
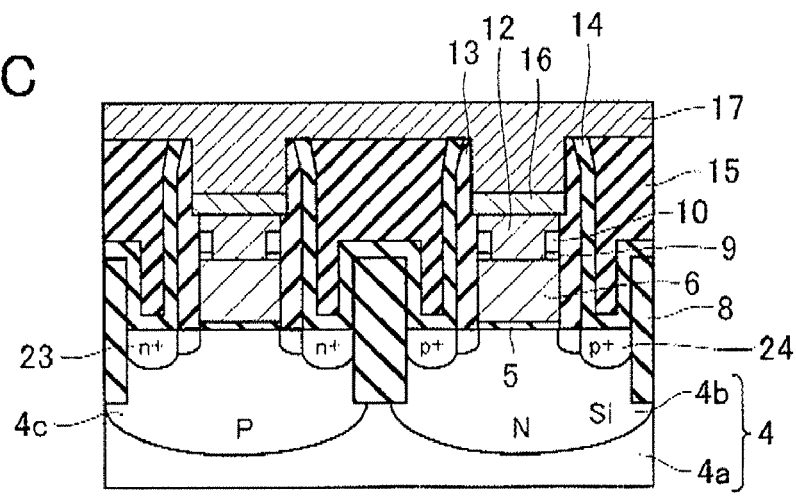

As shown in FIG. 11, a metal siliciding step is applied to deposit the forth electrode film 16 composed of, for example, polysilicon with uniformity to form a silicide uniformly. Then, as shown in FIG. 12, on the forth electrode film 16 with uniformity, a metal film is deposited, which is composed of one or two or more of cobalt, titanium, nickel and tungsten. Then, heating is applied to silicide the upper portion of the fourth electrode film 16. As a result, the metal silicide film 17 is formed on the forth electrode film 16.

Figure 13A:
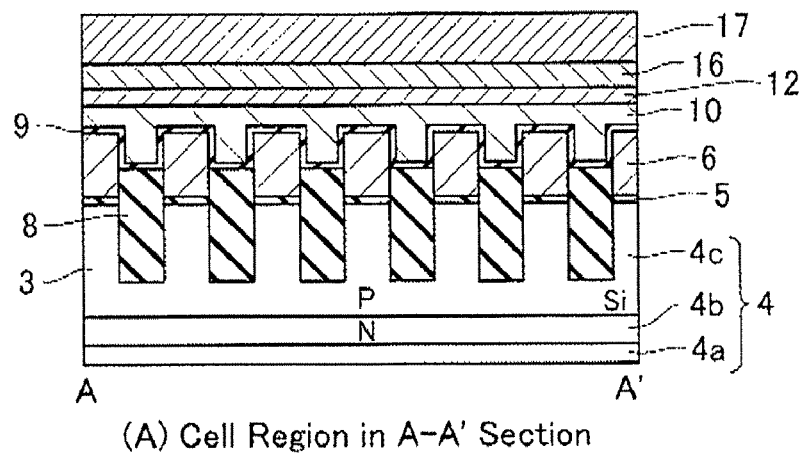
FIGS. 13A-13C are cross-sectional views showing the NAND-type EEPROM in order of process step.
Figure 13B:
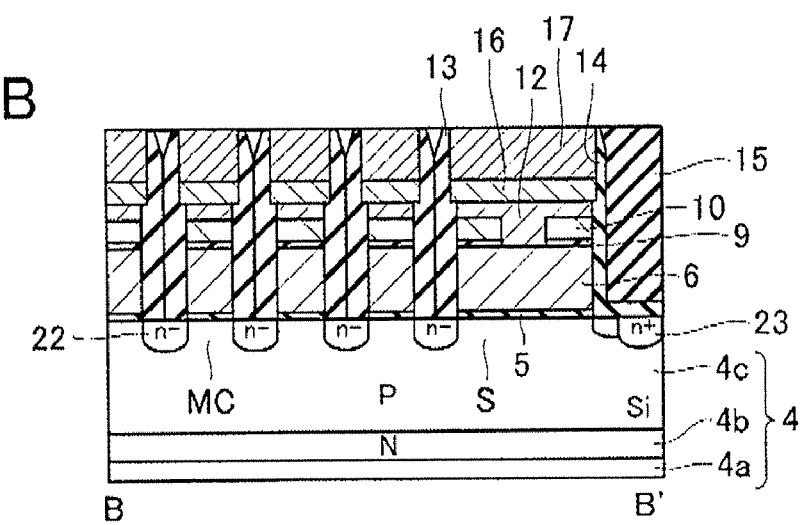
Figure 13C:
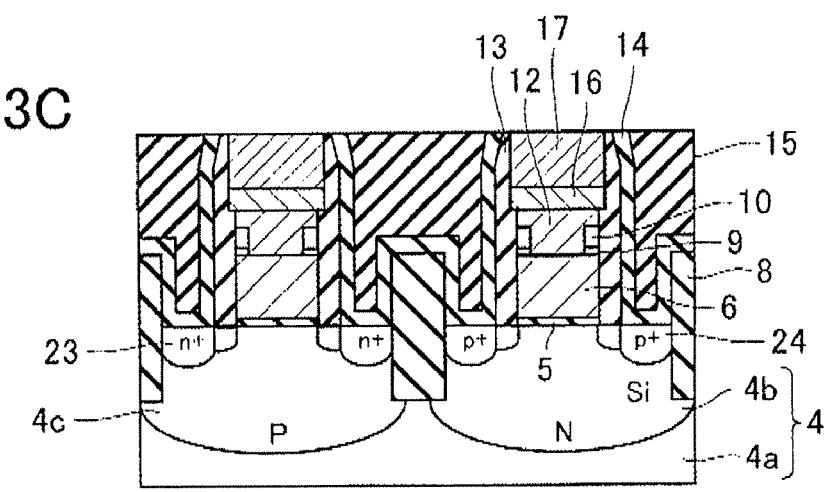

As shown in FIG. 13, a CMP technology is used to polish the upper layer portion of the metal silicide film 17 to separate the metal silicide film 17 into pieces. Thus, it is possible to realize the control gate having a larger gate width than the gate width formed after processing the gate electrode. It is also possible to form the cell transistor MC in which the upper portions of the third and fourth insulators 13, 14 serving as the inter-gate insulator and the upper portion of the control gate are completely planarized.

Figure 14A:
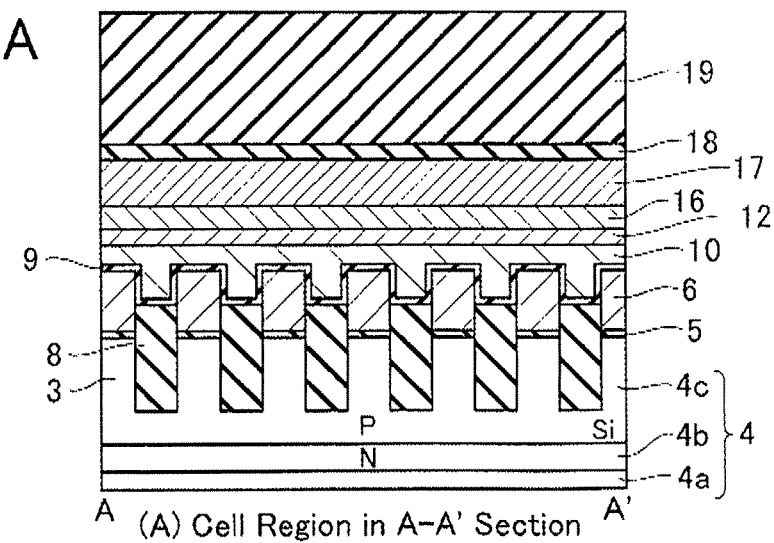
FIGS. 14A-14C are cross-sectional views showing the NAND-type EEPROM in order of process step.
Figure 14B:
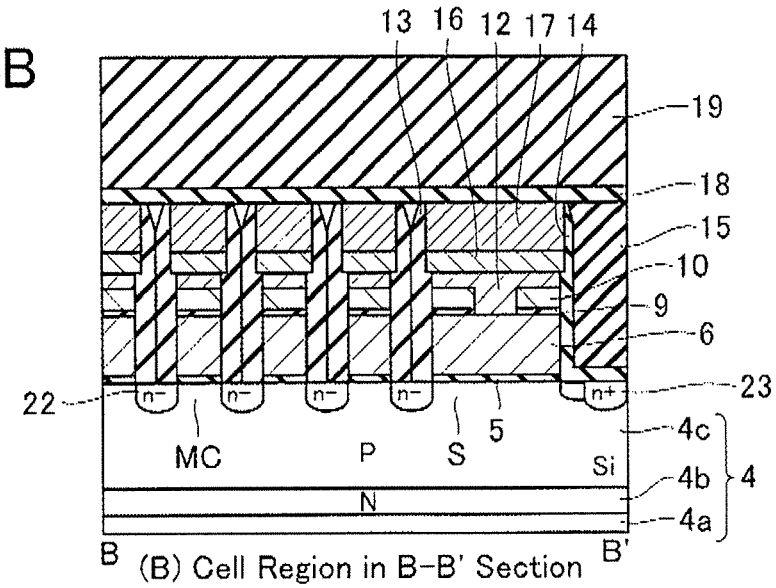
Figure 14C:
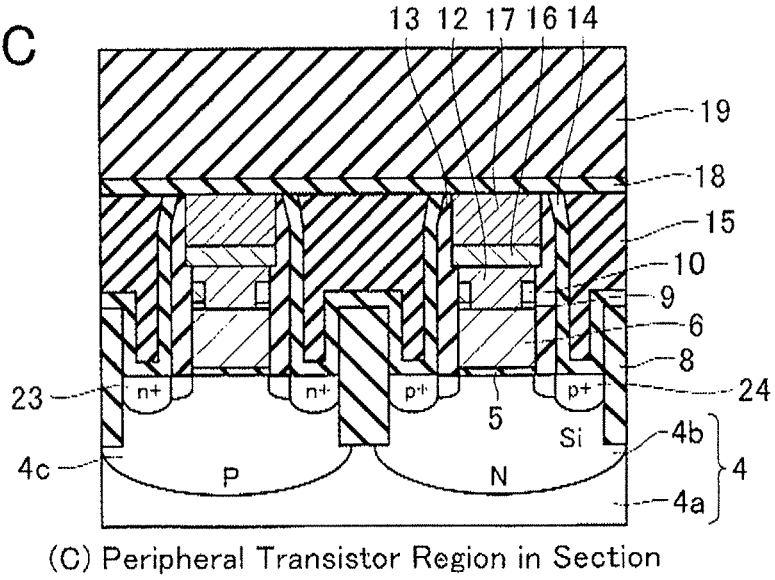

As shown in FIG. 14, a general contact formation step is applied to deposit the sixth insulator 18 and the seventh insulator 19. Then, as shown in FIG. 15, a general wiring formation step is applied to arrange the bit line 20, the metal wiring material 21, and the bit contact CB, which electrically connects the bit line 20 to the diffused layer 23 that adjoins the selection gate transistor S on the opposite side from the cell transistor MC. Thus, the NAND-type EEPROM of the present embodiment can be completed.

In accordance with the present embodiment, an NAND-type EEPROM comprises an NAND-type memory cell unit MCU including a circuit of serially connected cell transistors MC each having a structure with a floating gate and a control gate stacked via an insulator 9 on a semiconductor substrate serving as a channel region, and a pair of selection gate transistors S connected to both ends thereof. It also comprises a common source line SRC connected to one end of the memory cell unit MCU, and a bit line BL connected to the other end of the memory cell unit MCU. In this NAND-type EEPROM, the control gate composed of the triple-layered control gate electrode materials 10, 12, 16, 18 has an upper portion with a width formed wider along the gate length than the width of the floating gate composed of the floating gate electrode material 6. Therefore, it is possible to provide an NAND-type EEPROM that can suppress the increase in resistance of the control gate or the word line on formation of silicide, the increase in resistance variation due to unevenness among the metal silicide films, and the deterioration due to agglomeration. Namely, prior to the deposition of the fourth electrode film 16 as part of the control gate, the aperture width of the portion for deposition is extended. Then, the fourth electrode film 16 is deposited to form a metal silicide, thereby realizing a word line 2 with a larger control gate width. Thus, a uniform metal silicide film can be produced, thereby reducing the resistance of the word line 2, suppressing the variation, and suppressing the deterioration due to agglomeration.

Figure 17:
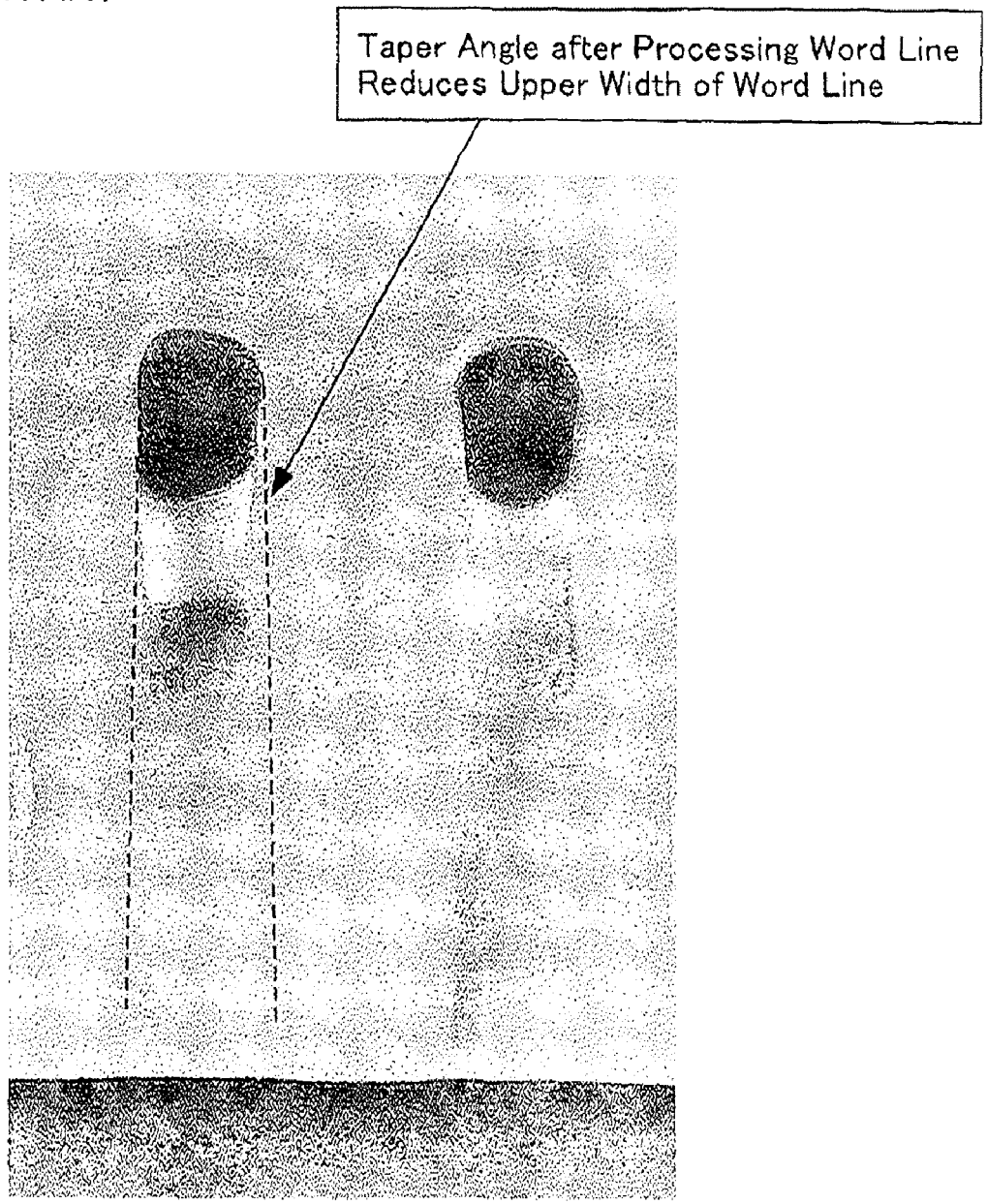
FIG. 17 is a cross-sectional view of a word line in a semiconductor memory device of prior art where a cell region is sectioned along a bit line.

In the semiconductor memory device, for example, as in a cross-section of the word line taken by sectioning the cell region along the bit line as shown in FIG. 17, fine pattering of word lines in accordance with fine-pattered NAND cells in recent years causes problems associated with word lines having increased resistances on formation of silicide, an increase in resistance variation due to unevenness among metal silicide and deterioration due to agglomeration. In contrast, in the above embodiment, the control gate contains the metal silicide film 17. In addition, the metal silicide film 17 is formed to have a larger width than the width of the floating gate along the gate length. Therefore, it is possible to suppress the increase in resistance of the word line on formation of silicide, the increase in resistance variation due to unevenness among the metal silicide films, and the deterioration due to agglomeration.

Specifically, if the floating gate has a width of 50 nm, the metal silicide film 17 (fourth electrode film 16) may be controlled to have a width of around 56 nm. In this case, even though the metal silicide film 17 located at the upper layer portion of the control gate is tapered, the width thereof can be retained at 50 nm or more. Namely, the width of the metal silicide film 17 is sufficient if it can be retained larger than the width of the floating gate when tapered. The width of the fourth electrode film 16 is known to cause a problem if it ins made as narrow as around 30 nm. Therefore, the width of the fourth electrode film 16 may be determined such that the fourth electrode film 16 may retain a sufficient width, for example, of 40 nm, which causes no problem even if it is smaller than the width of the floating gate.

As represented in FIGS. 2B-15B and FIGS. 2C-15C, also in the selection gate transistor S and the peripheral transistor, the upper layer portion of the gate is formed larger along the gate length than the width of the lower layer portion. Therefore, it is possible to suppress the increase in resistance of the word line on formation of silicide, the increase in resistance variation due to unevenness among the metal silicide films, and the deterioration due to agglomeration.

In the above embodiment, the NAND-type EEPROM is exemplified though the present invention is also applicable to other semiconductor memory devices such as a NOR-type one, needless to say.

What is claimed is:

1. A semiconductor memory device, comprising:
   a memory cell unit including at least one memory cell having a structure with a floating gate and a control gate stacked via an insulator on a semiconductor substrate, and
   an isolator being formed between memory cells adjoining along a gate length of the memory cell, said isolator contacting to the floating gate and the control gate of the memory cell continuously, wherein
   said control gate has at least an upper portion with a width along the gate length formed wider than the width of said floating gate, and wherein
   a width of the isolator between the upper portions of adjoining control gates is narrower than that of the isolator between adjoining floating gates.

2. The semiconductor memory device according to claim 1, wherein said control gate includes a metal silicide film,
   wherein said metal silicide film is formed wider along said gate length than the width of said floating gate.

3. The semiconductor memory device according to claim 2, wherein said metal silicide film is formed of one or two or more of cobalt, titanium, nickel and tungsten.

4. The semiconductor memory device according to claim 1, wherein said floating gate comprises a first electrode film composed of a floating gate electrode material,
   wherein said control gate is triple-layered with a second electrode film composed of a control gate electrode material, a third electrode film, and a fourth electrode film formed in an upper layer above said second and third electrode films.

5. The semiconductor memory device according to claim 4, wherein a metal silicide film is formed on said fourth electrode film.

6. The semiconductor memory device according to claim 5, wherein said metal silicide film has a wider width along said gate length than the width of said first electrode film.

7. The semiconductor memory device according to claim 1, wherein said control gate is formed so as to have an upper end on a position almost equal to a position of an upper end of the isolator.

8. The semiconductor memory device according to claim 1, wherein said memory cell-unit includes a circuit of memory cells NAND-connected, and a pair of selection transistors connected to both ends of said circuit,
   a common source line connected to one of said selection transistors, and
   a bit line connected to the other of said selection transistors,
   wherein said selection transistor has a selection gate formed by connecting said floating gate to said control gate via an aperture.

9. The semiconductor memory device according to claim 8, wherein said selection gate of said selection transistor has an upper layer portion with a width along the gate length formed wider than the width of a lower layer portion.

10. The semiconductor memory device according to claim 1, further comprising a peripheral transistor region,
    wherein said peripheral transistor region includes a peripheral transistor formed therein and having a gate formed by connecting said floating gate to said control gate via an aperture.

11. The semiconductor memory device according to claim 10, wherein said gate of said peripheral transistor has an upper layer portion with a width along the gate length formed wider than the width of a lower layer portion.

12. The semiconductor memory device according to claim 6, wherein said memory cell unit includes a circuit of memory cells NAND-connected, and a pair of selection transistors connected to both ends of said circuit,
    a common source line connected to one of said selection transistors, and
    a bit line connected to the other of said selection transistors,
    wherein said selection transistor has a selection gate formed by connecting said floating gate to said control gate via an aperture.

* * * * *